United States Patent
Kawasaki et al.

(10) Patent No.: US 8,810,762 B2
(45) Date of Patent: Aug. 19, 2014

(54) DISPLAY DEVICE EQUIPPED WITH TOUCH SENSOR

(75) Inventors: Tatsuya Kawasaki, Osaka (JP); Hiroshi Aichi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 131 days.

(21) Appl. No.: 13/700,818

(22) PCT Filed: May 27, 2011

(86) PCT No.: PCT/JP2011/062204
§ 371 (c)(1),
(2), (4) Date: Nov. 29, 2012

(87) PCT Pub. No.: WO2011/152307
PCT Pub. Date: Dec. 8, 2011

(65) Prior Publication Data
US 2013/0083258 A1    Apr. 4, 2013

(30) Foreign Application Priority Data

May 31, 2010 (JP) ................. 2010-124913

(51) Int. Cl.
| | | |
|---|---|---|
| *G02F 1/1343* | (2006.01) | |
| *H01L 27/15* | (2006.01) | |
| *G02F 1/1347* | (2006.01) | |
| *G02F 1/1362* | (2006.01) | |
| *G02F 1/133* | (2006.01) | |
| *G02F 1/1333* | (2006.01) | |
| *G06F 3/041* | (2006.01) | |
| *G06F 3/042* | (2006.01) | |

(52) U.S. Cl.
CPC .......... *G02F 1/13318* (2013.01); *H01L 27/156* (2013.01); *G02F 1/13471* (2013.01); *G02F 1/136286* (2013.01); *G02F 1/13338* (2013.01); *G06F 3/0412* (2013.01); *G06F 3/042* (2013.01)
USPC .......................................... 349/140; 257/458

(58) Field of Classification Search
CPC ............... H01L 27/3244; H01L 27/14609; H01L 27/14643; H01L 27/307; H01L 27/3269; H01L 27/124; H01L 27/3265; H01L 27/3276; H01L 29/78603; H01L 29/41733; H01L 29/78696; H01L 29/78618; H01L 29/786; H01L 29/78609; H01L 29/78678; H01L 29/861; H01L 29/868; H01L 31/101; H01L 31/105; H01L 21/02488; G02F 2001/13312; G02F 1/13318; G02F 1/1362; G02F 1/136213; G02F 1/136286; G02F 1/1368; G02F 2201/58; G09G 2360/144; G09G 2360/14; G09G 2360/142; G09G 3/3648; G09G 2300/0426; H04N 5/335; H04N 5/374; G01J 1/1626; G01J 1/4204
USPC .......... 438/161, 151, 158, 197; 345/175, 207, 345/81, 87; 257/E21.409, E29.273, 59, 257/288, E31.061, 458, E27.016, E27.1, 257/E27.132, E29.151, E31.073, E33.076, 257/192, 21, 257, 461, 656; 250/214.1, 250/208.2, 214 R, 208.1; 349/1, 140, 46
See application file for complete search history.

(56) References Cited

U.S. PATENT DOCUMENTS 6,236,063 B1 * 5/2001 Yamazaki et al. .............. 257/59

FOREIGN PATENT DOCUMENTS

JP         2009-135185 A    6/2009

*Primary Examiner* — Thoi Duong
(74) *Attorney, Agent, or Firm* — Chen Yoshimura LLP

(57) ABSTRACT

Disclosed is a display device that has a light detecting element (D1) disposed in a pixel region (1), an opening (a through hole) (19a) formed in an insulating film (19) that is disposed above the light detecting element (D1), and a transparent electrode (20) formed in the opening (19a), and that can reduce occurrence of leakage between the transparent electrode (20) and other wiring line (SL). Specifically disclosed is a display device that has an active matrix substrate (100) in which a first wiring line (SL) and a second wiring line (GL) are formed so as to cross each other, and a light detecting element (D1) disposed on a pixel region (1) in the active matrix substrate (100). The display device has a first insulating film (17) formed between the first wiring line (SL) and the second wiring line (GL), a second insulating film (19) disposed on the first insulating film (17), and a transparent electrode (20) formed above the light detecting element (D1) so as to enter a through hole (19a) formed in the second insulating film (19). The first wiring line (SL) has a discontinuous section at a part adjacent to the light detecting element, and both ends of the discontinuous section are electrically connected to each other through an auxiliary wiring line (16) disposed in the same layer as that of the second wiring line (GL).

9 Claims, 7 Drawing Sheets

DISPLAY DEVICE EQUIPPED WITH TOUCH SENSOR

TECHNICAL FIELD

The present invention relates to a display device having light detecting elements in pixels.

BACKGROUND ART

Conventionally, display devices having an image capturing function have been proposed. Such display devices are provided with light detecting elements such as photodiodes, for example, in pixels, and can thereby capture an image of an object approaching to a display. These display devices having the image capturing function are to be used for a two-way communication display device or for a display device having a touch panel function.

In a conventional display device having an image capturing function, when known components such as signal lines, scan lines, TFTs (Thin Film Transistors), and pixel electrodes are formed on an active matrix substrate by a semiconductor process, photodiodes are simultaneously formed in pixels. Such a conventional display device having the image capturing function is disclosed in Japanese Patent Application Laid-Open Publication No. 2009-135185 and the like, for example.

The display device disclosed in the above Patent Document is provided with optical sensor elements having a so-called PIN thin film diode structure. FIG. 12 is a cross-sectional view showing a configuration of an optical sensor element disclosed in the above Patent Document. As shown in FIG. 12, in a conventional optical sensor element S disclosed in the above Patent Document, a first control electrode G1, which is made of a light reflective material such as aluminum, for example, is formed on a substrate 91. A gate insulating film 95 is disposed to cover the first control electrode G1. On the gate insulating film 95, a semiconductor layer 97, which is made of polysilicon, oxide semiconductor, or the like, is patterned and formed so as to cross over the first control electrode G1. The semiconductor layer 97 has a p-type region 97p and an n-type region 97n, and a light receiving section (i-type region) 97i is disposed therebetween.

An interlayer insulating film 99, which is made of a light transmissive material, is disposed to cover the semiconductor layer 97. On the interlayer insulating film 99, respective wiring lines 101, which are connected to the p-type region 97p and the n-type region 97n through connection holes, are disposed. A planarizing insulating film 103, which is made of a light transmissive material, is disposed on the interlayer insulating film 99, covering the respective wiring lines 101. In the planarizing insulating film 103, an opening 103a, which is a wide opening above the light receiving section 97i and has the interlayer insulating film 99 as a bottom surface, is formed.

On the planarizing insulating film 103, a second control electrode G2 is disposed so as to face the light receiving section 97i through the interlayer insulating film 99 at the bottom of the opening 103a. This way, on the respective sides of the semiconductor layer 97, the first control electrode G1 and the second control electrode G2 are disposed so as to sandwich the i-type region 97i through the gate insulating film 95 and the interlayer insulating film 99, respectively. The first control electrode G1 and the second control electrode G2 are wired so as not to be electrically connected to each other.

In this conventional configuration, pairs of holes and electrons generated by receiving light at the i-type region can be separated in a film thickness direction in the i-type region by applying different potentials to the first control electrode G1 and to the second control electrode G2, respectively. As a result, the holes can move to the anode (p-type region) direction and the electrons can move to the cathode (n-type region) direction while separating the holes and the electrons in a film thickness direction in the i-type region. As a result, the pairs of the holes and the electrons generated by incident light become less likely to be recombined while moving inside the i-type region, thereby improving efficiency in obtaining a current.

However, in the conventional configuration disclosed in Japanese Patent Application Laid-Open Publication No. 2009-135185 described above, as shown in FIG. 12, wiring lines 101p and 101n respectively connected to the p-type region 97p and the n-type region 97n are disposed on the same layer as and adjacently to the second control electrode G2 placed on the bottom of the opening 103a. This may cause leakage between the wiring lines 101p and 101n and the second control electrode G2 as a result of a wiring defect, entry of a foreign object, or the like occurring in a manufacturing process.

SUMMARY OF THE INVENTION

In view of the above problems, the present invention aims at achieving a display device that is provided with light detecting elements in pixels and that can suppress leakage between the transparent electrode and other wiring lines in a configuration in which an opening is formed in an insulating film that is disposed above the light detecting elements, and the transparent electrode is formed in the opening, in particular.

In order to achieve the above object, a display device disclosed herein is provided with: an active matrix substrate having a first wiring line and a second wiring line formed so as to cross each other; a light detecting element disposed in a pixel region in the active matrix substrate; a first insulating film interposed between the first wiring line and the second wiring line; a second insulating film disposed on the first insulating film; and a transparent electrode formed above the light detecting element so as to reach inside of a through hole formed in the second insulating film, wherein the first wiring line has a discontinuous section at a part adjacent to the light detecting element, and both ends of the first wiring line at the discontinuous section are electrically connected to each other through an auxiliary wiring line disposed in a same layer as the second wiring line.

According to this configuration, it is possible to achieve a display device that has light detecting elements in the pixel region, an opening (through hole) formed in the insulating film disposed above the light detecting elements, and a transparent electrode formed in the opening and that can reduce occurrence of leakage between the transparent electrode and other wiring lines.

DETAILED DESCRIPTION OF EMBODIMENTS

Figure 1:
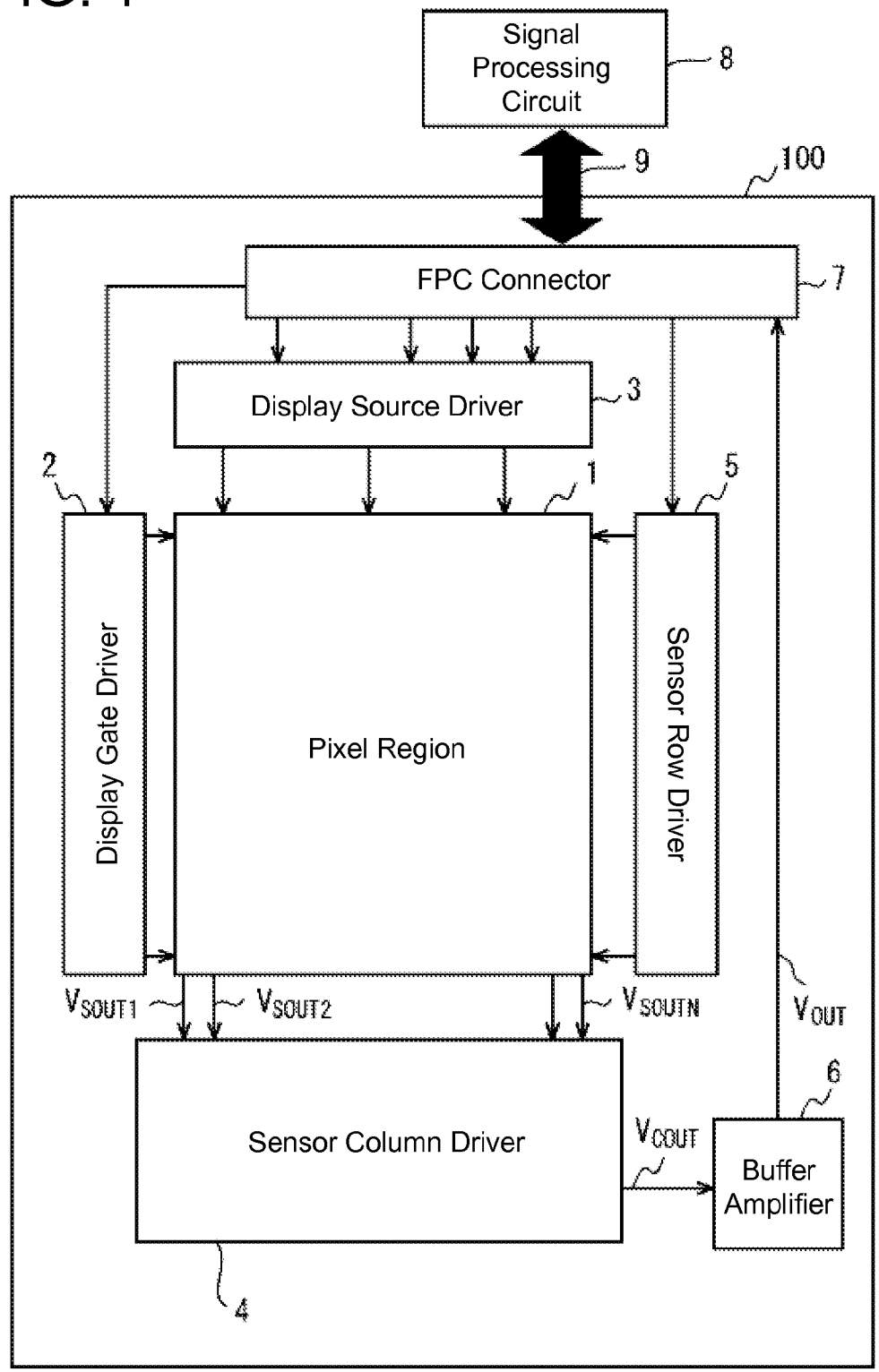
FIG. 1 is a schematic block diagram showing a configuration of a display device according to an embodiment of the present invention.

A display device according to an embodiment of the present invention is provided with: an active matrix substrate having a first wiring line and a second wiring line formed so as to cross each other; a light detecting element disposed in a pixel region in the active matrix substrate; a first insulating film interposed between the first wiring lines and the second wiring lines; a second insulating film disposed on the first insulating film; and a transparent electrode formed above the light detecting element so as to reach inside of a through hole formed in the second insulating film. The first wiring line has a discontinuous section at a part adjacent to the light detecting element. Both ends of the first wiring line at the discontinuous section are electrically connected to each other through an auxiliary wiring line disposed in a same layer as that of the second wiring line.

According to this configuration, even when components of the light detecting element and the first wiring line are disposed in the same layer, by forming the discontinuous section in the first wiring line at a part adjacent to the light detecting element, leakage between the components and the first wiring line can be prevented. Both ends of the first wiring line at the discontinuous section are electrically connected to each other through the auxiliary wiring line disposed on the same layer as that of the second wiring line. Therefore, the first wiring line can maintain electrical connection.

In the above configuration, it is preferable that the first wiring line be a source wiring line, and the second wiring line be a gate wiring line, for example. Alternatively, the first wiring line may be a gate wiring line, and the second wiring line may be a source wiring line.

Further, the first wiring line may be a sensor driver wiring line that supplies a signal to the light detecting element, and the second wiring line may be a source wiring line. The sensor driver wiring line is a reset wiring line that supplies a reset signal to the light detecting element, a read-out wiring line that supplies a read-out signal to the light detecting element, or a power supply wiring line that supplies a constant-potential signal to the light detecting element, for example.

It is preferable that the width of the auxiliary wiring line be wider than that of the first wiring line so as to reduce a wiring resistance at the discontinuous section.

The display device according to this embodiment can be a liquid crystal display device that is further provided with an opposite substrate that faces the active matrix substrate and liquid crystal sandwiched between the active matrix substrate and the opposite substrate, for example.

Embodiments

Embodiments of the present invention will be described below in detail with reference to figures. Embodiments described below show examples of configurations in which a display device according to the present invention is a liquid crystal display device. However, the display device of the present invention is not limited to a liquid crystal display device, but can be applied to an appropriate display device in which an active matrix substrate is used. The display device of the present invention can be used as a display device equipped with a touch panel having an image capturing function and performing input operation by detecting an object approaching to a screen, a two-way communication display device having a display function and an imaging function, and the like.

For ease of explanation, respective figures being referred to in the description below schematically show only primary components that are necessary to describe the present invention, out of components of embodiments of the present invention. Therefore, the display device according to the present invention may be, as necessary, provided with components that are not shown in the respective figures referred to in the present specification. Dimensions of the components in the respective figures do not accurately represent dimensions of actual components, dimensional ratios of the respective components, and the like.

Embodiment 1

First, a configuration of an active matrix substrate provided in a liquid crystal display device according to Embodiment 1 of the present invention will be described with reference to FIGS. 1 and 2.

FIG. 1 is a schematic block diagram showing a configuration of an active matrix substrate 100 provided in the liquid crystal display device according to an embodiment of the present invention. As shown in FIG. 1, the active matrix substrate 100 is at least provided with a pixel region 1, a display gate driver 2, a display source driver 3, a sensor column driver 4, a sensor row driver 5, a buffer amplifier 6, and an FPC connector 7, on a glass substrate. Further, a signal processing circuit 8 is connected to the active matrix substrate 100 through the FPC connector 7 and an FPC 9. The signal processing circuit 8 processes an image signal that is captured by a light detecting element (which will be described later) in the pixel region 1.

The above components of the active matrix substrate 100 can be formed integrally on a glass substrate by a semiconductor process. Alternatively, amplifiers or drivers out of the above components may be mounted on the glass substrate by a COG (Chip On Glass) technique or the like, for example. Further, at least some of the above components of the active matrix substrate 100 shown in FIG. 1 may be mounted on the FPC 9. The active matrix substrate 100 is bonded to an opposite substrate (not shown) having an opposite electrode formed on the entire surface, and liquid crystal materials are sealed therebetween.

The pixel region 1 is a region having a plurality of pixels formed therein to display an image. In this embodiment, optical sensors for capturing an image are provided in the respective pixels in the pixel region 1. FIG. 2 is an equivalent circuit diagram showing an arrangement of the pixel and the optical sensor in the pixel region 1 in the active matrix substrate 100. In the example shown in FIG. 2, one pixel is formed of picture elements (also referred to as "subpixels") of three colors that are R (red), G (green), and B (blue). In one pixel made of the three picture elements, one optical sensor is provided. The pixel region 1 has the pixels arranged in a matrix with M rows and N columns and the optical sensors similarly arranged in a matrix with M rows and N columns. According to the above description, a number of the picture elements is M×3N.

Figure 2:
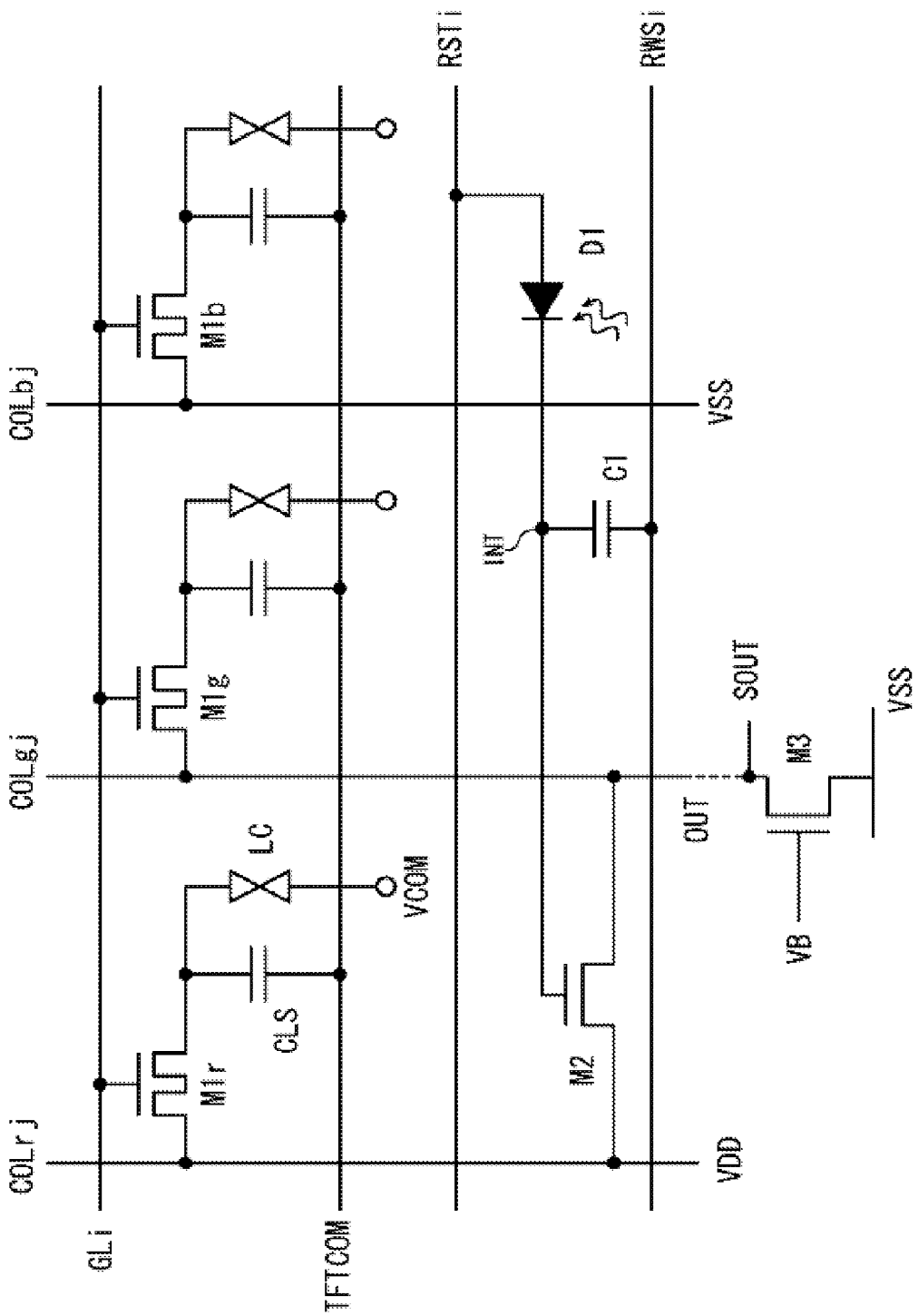
FIG. 2 is an equivalent circuit diagram showing a configuration of a pixel of the display device according to an embodiment of the present invention.

As shown in FIG. 2, the pixel region 1 has gate lines GL and source lines COL arranged in a matrix as wiring lines for the pixels. The gate lines GL are connected to the display gate driver 2. The source lines COL are connected to the display source driver 3. In the pixel region 1, an M number of rows of the gate lines GL are formed. If the individual gate lines GL need to be distinguished from each other in the description below, each gate line GL will be represented as GLi (i=1 to M). On the other hand, the three source lines COL are formed per pixel to supply image data to the respective three picture elements in one pixel as described above. If the individual source lines COL need to be distinguished from each other in the description, respective source lines COL will be represented as COLrj, COLgj, and COLbj (j=1 to N).

For respective intersections of the gate lines GL and the source lines COL, thin-film transistors (TFTs) M1 are disposed as switching elements for the pixels. In FIG. 2, the TFTs M1 provided for the respective red, green, and blue picture elements are represented as M1$r$, M1$g$, and M1$b$. Gate electrodes of the TFTs M1 are connected to the gate lines GL, source electrodes of the TFTs M1 are connected to the source lines COL, and drain electrodes of the TFT M1 are connected to the not-shown pixel electrodes. As shown in FIG. 2, a liquid crystal capacitance LC is formed between the drain electrode of each TFT M1 and the opposite electrode (VCOM). An auxiliary capacitance CLS is formed between each drain electrode and a TFTCOM.

A picture element driven by the TFT M1$r$ that is connected to an intersection of one gate line GLi and one source line COLrj shown in FIG. 2 functions as a red picture element by having a red color filter disposed so as to correspond to this picture element and by being supplied with red image data from the display source driver 3 through the source line COLrj. A picture element driven by the TFT M1$g$ that is connected to an intersection of one gate line GLi and one source line COLgj shown in FIG. 2 functions as a green picture element by having a green color filter disposed so as to correspond to this picture element and by being supplied with green image data from the display source driver 3 through the source line COLgj. A picture element driven by the TFT M1$b$ that is connected to an intersection of one gate line GLi and one source line COLbj shown in FIG. 2 functions as a blue picture element by having a blue color filter disposed so as to correspond to this picture element and by being supplied with blue image data from the display source driver 3 through the source line COLbj.

In the example shown in FIG. 2, one optical sensor is provided for one pixel (three picture elements) in the pixel region 1. However, in arranging the pixels and the optical sensor, the ratio between the two is not limited to this example, and can be chosen appropriately. One optical sensor may be provided for one picture element, or one optical sensor may be provided for a plurality of pixels, for example.

As shown in FIG. 2, the optical sensor includes a photodiode D1 as a light detecting element, a capacitor C1, and a transistor M2. In the example shown in FIG. 2, the source line COLrj doubles as a wiring line VDD that supplies a constant voltage $V_{DD}$ from the sensor column driver 4 to the optical sensor. The source line COLgj doubles as a wiring line OUT for sensor output.

To the anode of the photodiode D1, a wiring line RST is connected to supply the reset signal. To the cathode of the photodiode D1, one end of an electrode of the capacitor C1 and the gate of the transistor M2 are connected. The drain of the transistor M2 is connected to the wiring line VDD, and the source of the transistor M2 is connected to the wiring line OUT. In FIG. 2, a connection point of the cathode of the photodiode D1, one end of the electrode of the capacitor C1, and the gate of the transistor M2 is represented as INT. The other end of the electrode of the capacitor C1 is connected to a wiring line RWS that supplies a read-out signal. The wiring lines RST and RWS are connected to the sensor row driver 5. The wiring lines RST and RWS are formed in every row. If the respective wiring lines need to be distinguished from each other below, the respective wiring lines will be represented as RSTi and RWSi (i=1 to M).

The sensor row driver 5 sequentially selects every set of the wiring lines RSTi and RWSi shown in FIG. 2 at a prescribed time interval $t_{row}$. This way, rows of the optical sensors from which signal charges are to be read out are sequentially selected in the pixel region 1.

As shown in FIG. 2, an end of the wiring line OUT is connected to the drain of an insulated-gate field-effect transistor M3. The drain of the transistor M3 is connected to an output wiring line SOUT. A potential $V_{SOUT}$ of the drain of the transistor M3 is output to the sensor column driver 4 as an output signal from the optical sensor. The source of the transistor M3 is connected to a wiring line VSS. The gate of the transistor M3 is connected to a reference voltage power supply (not shown) through a reference voltage wiring line VB.

FIG. 1 shows an example in which the sensor column driver 4 is provided separately from the display source driver 3. Alternatively, the display source driver 3 may double as the sensor column driver 4.

Figure 3:
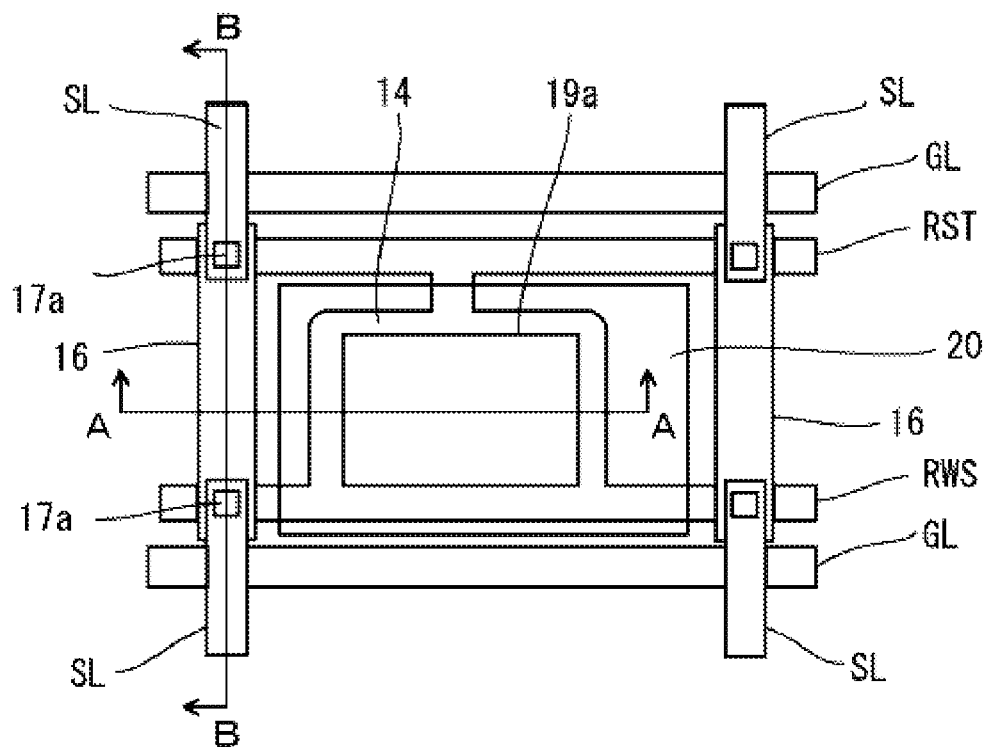
FIG. 3 is a schematic plan view showing a configuration of an optical sensor of the display device according to Embodiment 1.
Figure 4:
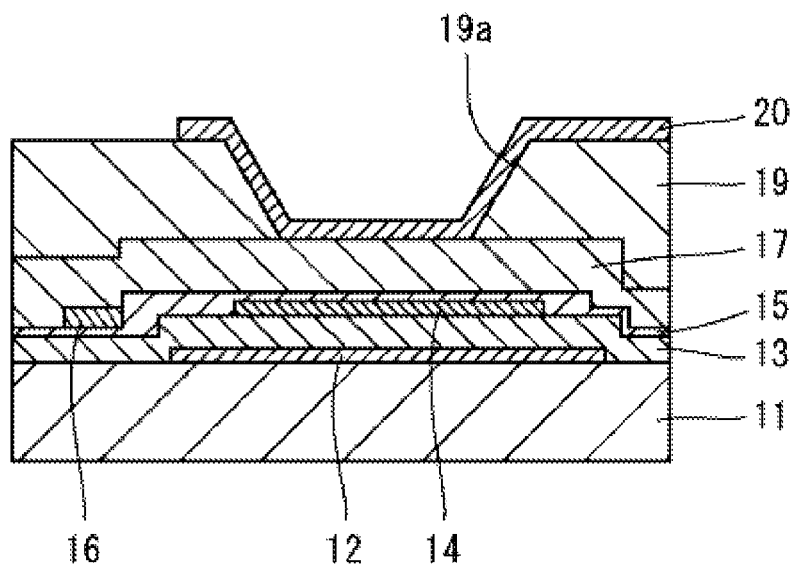
FIG. 4 is a cross-sectional view along the line A-A in FIG. 3.
Figure 5:
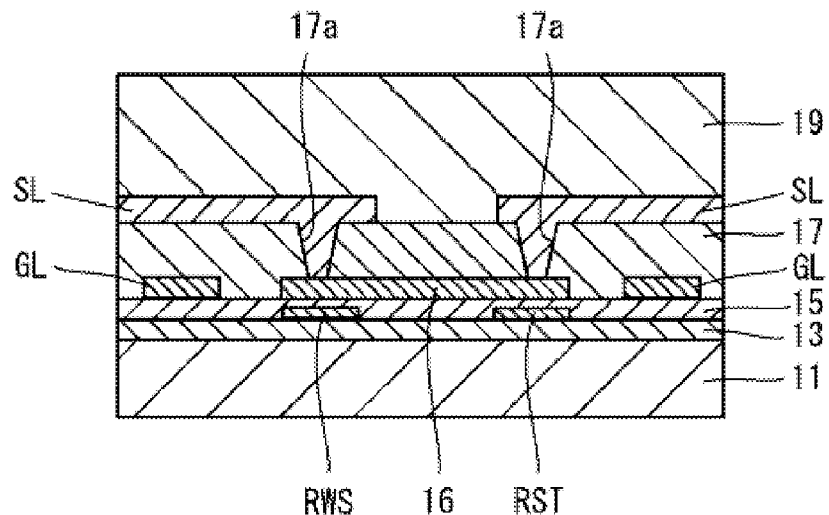
FIG. 5 is a cross-sectional view along the line B-B in FIG. 3.

Next, a configuration of the optical sensor of this embodiment will be described. FIG. 3 is a schematic plan view showing a configuration of the optical sensor of the display device of this embodiment. FIG. 4 is a cross-sectional view along the line A-A in FIG. 3. FIG. 5 is a cross-sectional view along the line B-B in FIG. 3.

As shown in FIGS. 3 and 4, the optical sensor of this embodiment has a light-shielding film 12 on a surface of a glass substrate 11. The light-shielding film 12 is formed of a molybdenum thin film or the like, for example, and prevents direct light emitted from a backlight from entering a light receiving section of the photodiode D1. A base coat insulating film 13 is disposed on the glass substrate 11 and the light-shielding film 12. The base coat insulating film 13 can be made of SiNO, $SiO_2$, or the like, for example.

On the base coat insulating film 13, a semiconductor layer 14 for the photodiode D1 is formed in an island shape. The semiconductor layer 14 can be formed of continuous grain silicon (CGS), low temperature polysilicon (LPS), amorphous silicon (a-Si), or the like, for example, but the material of the semiconductor layer 14 is not limited to these. Other semiconductor materials may be used to form the semiconductor layer 14. The semiconductor layer 14 has a "p" layer, an "i" layer, and an "n" layer, which are not shown in FIGS. 3 and 4, formed in this order in a plane direction by ion doping. That is, the photodiode D1 of this embodiment is formed as a PIN photodiode having a so-called lateral structure. Further, on the base coat insulating film 13, the wiring lines RST and RWS are formed.

On the semiconductor layer 14, a gate insulating film 15 is formed. For the gate insulating film 15, an $SiO_2$ film or an SiN film, for example, can be used. The gate insulating film 15 may have a double-layer structure of an $SiO_2$ film and an SiN film.

A source auxiliary wiring line 16 is formed on the gate insulating film 15 in an area that does not overlap the semiconductor layer 14 or a transparent electrode 20, which will be described later, in the normal direction to the substrate. The source auxiliary wiring line 16 is formed of the same material as that of the gate line GL and a gate electrode of the TFT, which is not shown in FIGS. 3 and 4, and is formed in the same layer as the gate line GL and the gate electrode. That is, the gate line GL, the gate electrode, and the source auxiliary wiring line 16 are simultaneously formed by patterning and etching a metal film that was deposited as a material film. It is preferable that the gate line GL, the gate electrode, and the source auxiliary wiring line 16 have a double-layer structure of tungsten (W) and tantalum nitride (TaN), for example. Other examples of the gate line GL, the gate electrode, and the source auxiliary wiring line 16 include molybdenum tungsten alloy (MoW), a double-layer structure of titanium and aluminum, and the like, for example.

On the source auxiliary wiring line 16 and the gate insulating film 15, a buffer film 17 (first insulating film) is disposed. It is preferable that the buffer film 17 have a double-layer structure of an $SiO_2$ film and an SiN film, or have a triple-layer structure of two $SiO_2$ films sandwiching an SiN film. Alternatively, the buffer film 17 may have a single-layer structure of an $SiO_2$ film or an SiN film.

On the buffer film 17, a source line SL is formed. Specific examples of a structure of the source line SL are including, but not limited to: a triple-layer structure of two titanium layers sandwiching an aluminum layer; a double-layer structure of a titanium layer and an aluminum layer; a triple-layer structure of two titanium nitride (TiN) layers sandwiching an aluminum layer; a triple-layer structure of two molybdenum layers sandwiching an aluminum neodymium alloy (Al—Nd) layer; and a triple-layer structure of two molybdenum layers sandwiching an aluminum layer.

As shown in FIGS. 3 and 5, the source line SL is discontinued at a part adjacent to the photodiode D1. At the discontinuous section, the source line SL is replaced by the source auxiliary wiring line 16. The source line SL and the source auxiliary wiring line 16 are respectively formed in layers different from each other, sandwiching the buffer film 17 therebetween. Both ends of the source auxiliary wiring line 16 in a direction in which the source line SL extends are respectively connected to the source line SL through contact holes 17a that penetrate the buffer film 17.

On the buffer film 17 and the source line SL, an interlayer insulating film 19 (second insulating film) is disposed to obtain insulation between the transparent electrode 20, which will be described later, and the source line SL. The interlayer insulating film 19 is formed of an acrylic resin or the like, for example. In a part of the interlayer insulating film 19, a contact hole 19a that penetrates the interlayer insulating film 19 is formed.

On a surface of the interlayer insulating film 19, the transparent electrode 20 is disposed. The transparent electrode 20 can be formed of a transparent electrode film made of indium tin oxide (ITO), a transparent electrode film made of indium oxide and zinc oxide, or the like, for example.

The transparent electrode 20 is disposed above the "i" layer of the semiconductor layer 14 in order to enhance characteristics and improve reliability of the photodiode D1. It is preferable that a large bottom surface area be secured for the contact hole 19a to improve sensitivity of the photodiode D1. However, unlike the conventional configuration described above, in the configuration of this embodiment, the source line SL has a discontinuous section at a part adjacent to the photodiode D1, and at the discontinuous section, the source line SL is replaced by the source auxiliary wiring line 16. That is, the source line SL is not present at a part adjacent to the photodiode D1 in the same layer as the bottom surface of the contact hole 19a (i.e., a surface of the buffer film 17). Therefore, unlike the conventional configuration, leakage between the transparent electrode 20 formed on the bottom surface of the contact hole 19a and the source line SL is prevented.

Embodiment 2

Embodiment 2 of the present invention will be described below. The same components as those in Embodiment 1 described above will be given the same reference characters, and a detailed description thereof will not be repeated.

Figure 6:
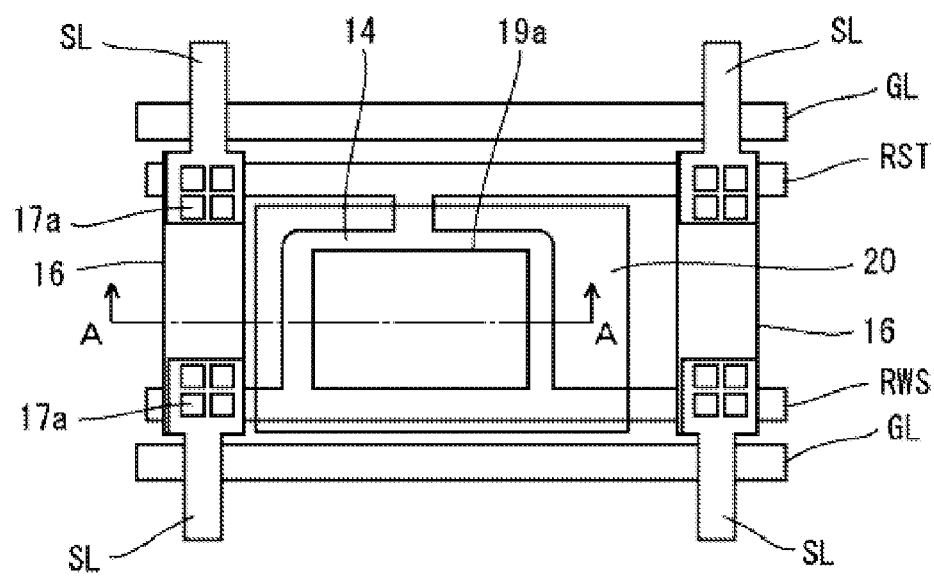
FIG. 6 is a schematic plan view showing a configuration of the optical sensor of a display device according to Embodiment 2.
Figure 7:
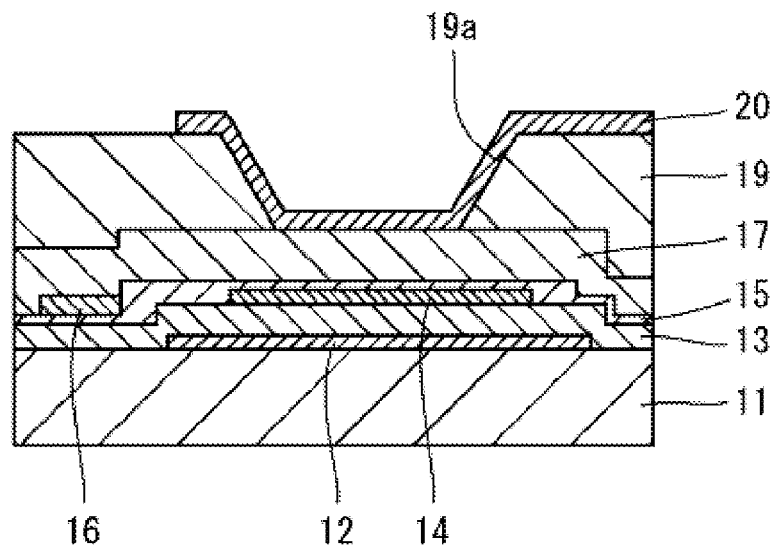
FIG. 7 is a cross-sectional view along the line A-A in FIG. 6.

FIG. 6 is a schematic plan view showing a configuration of the optical sensor of the display device of this embodiment. FIG. 7 is a cross-sectional view along the line A-A in FIG. 6.

The configuration of this embodiment differs from that of Embodiment 1 in that the width of the source auxiliary wiring line 16 is formed wider than that of the source line SL. By forming the source auxiliary wiring line 16 to be wider as described above, it is possible not only to prevent leakage between the transparent electrode 20 on the bottom surface of the contact hole 19a and the source line SL, but also to reduce a wiring resistance of the source auxiliary wiring line 16. The width of the source auxiliary wiring line 16 of this embodiment can be appropriately determined in accordance with a difference in the resistance ratio between the material of the source line SL and the material of the source auxiliary wiring line 16, the length of the source auxiliary wiring line 16, and the like.

Embodiment 3

Embodiment 3 of the present invention will be described below. The same components as those in Embodiment 1 described above will be given the same reference characters, and a detailed explanation thereof will not be repeated.

Figure 8:
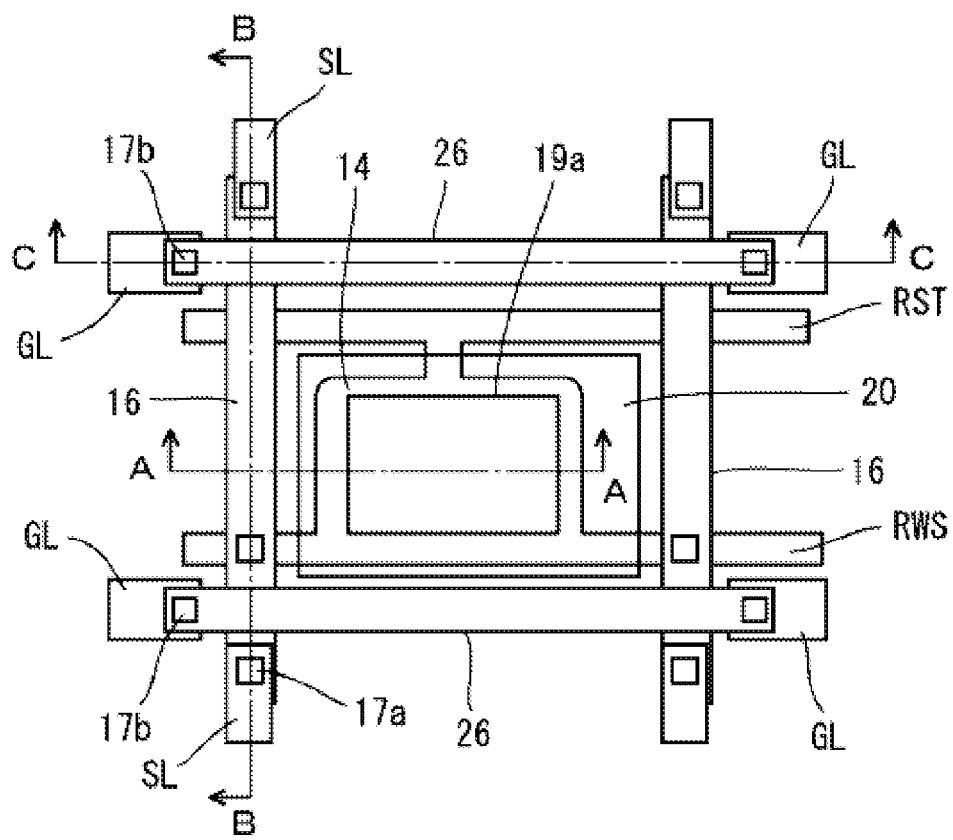
FIG. 8 is a schematic plan view showing a configuration of the optical sensor of a display device according to Embodiment 3.
Figure 9:
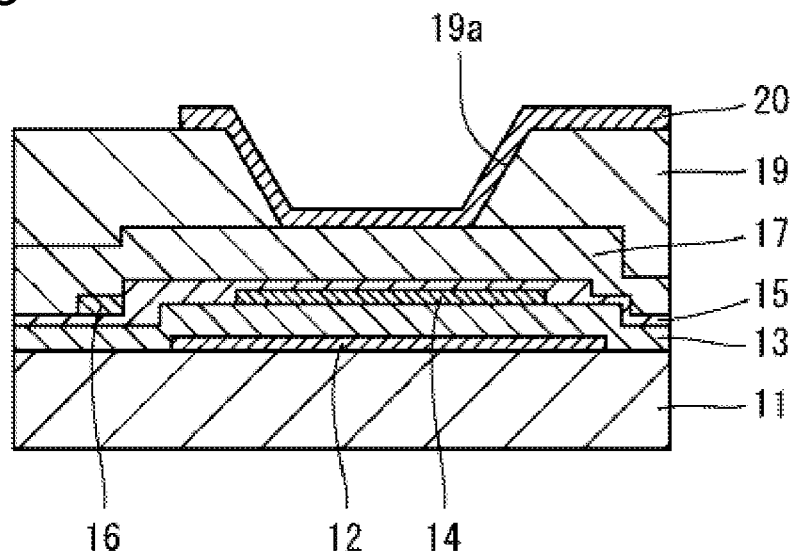
FIG. 9 is a cross-sectional view along the line A-A in FIG. 8.
Figure 10:
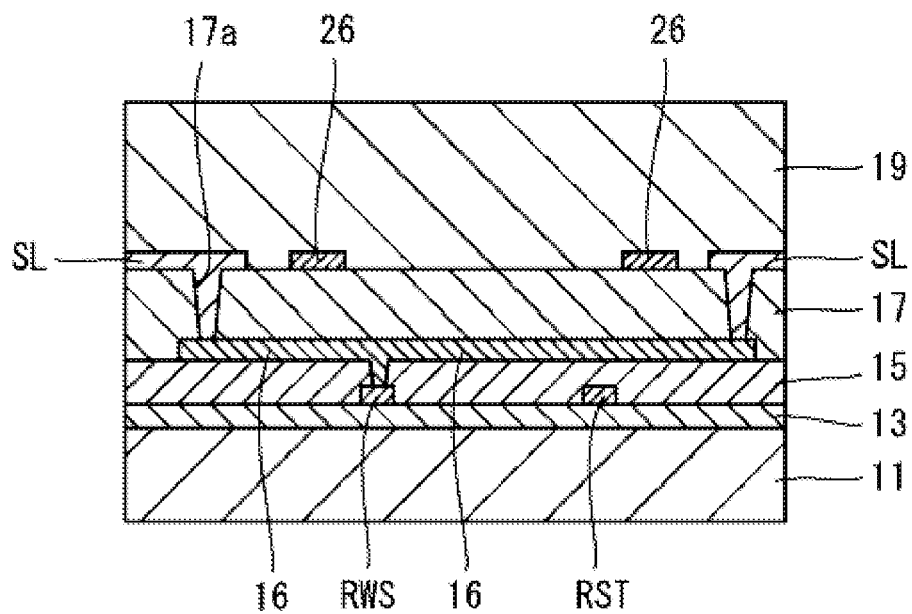
FIG. 10 is a cross-sectional view along the line B-B in FIG. 8.
Figure 11:
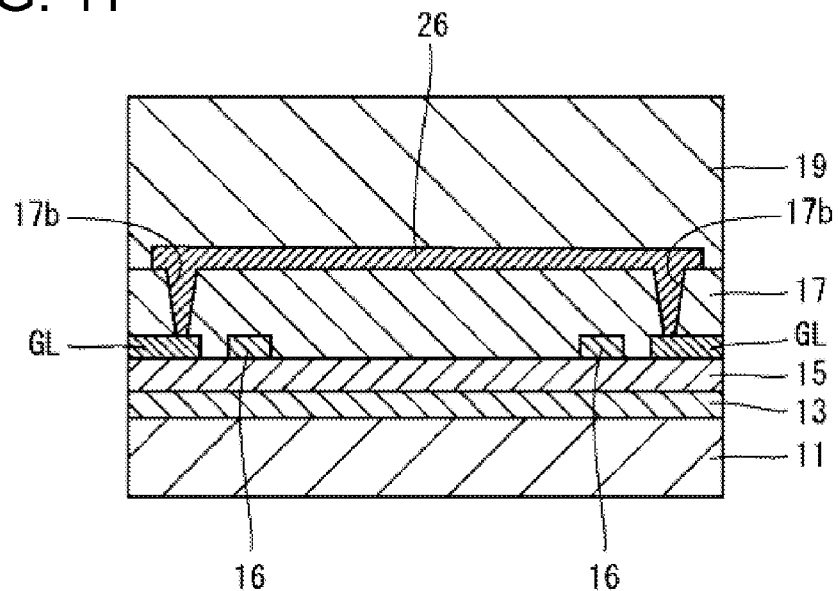
FIG. 11 is a cross-sectional view along the line C-C in FIG. 8.
Figure 12:
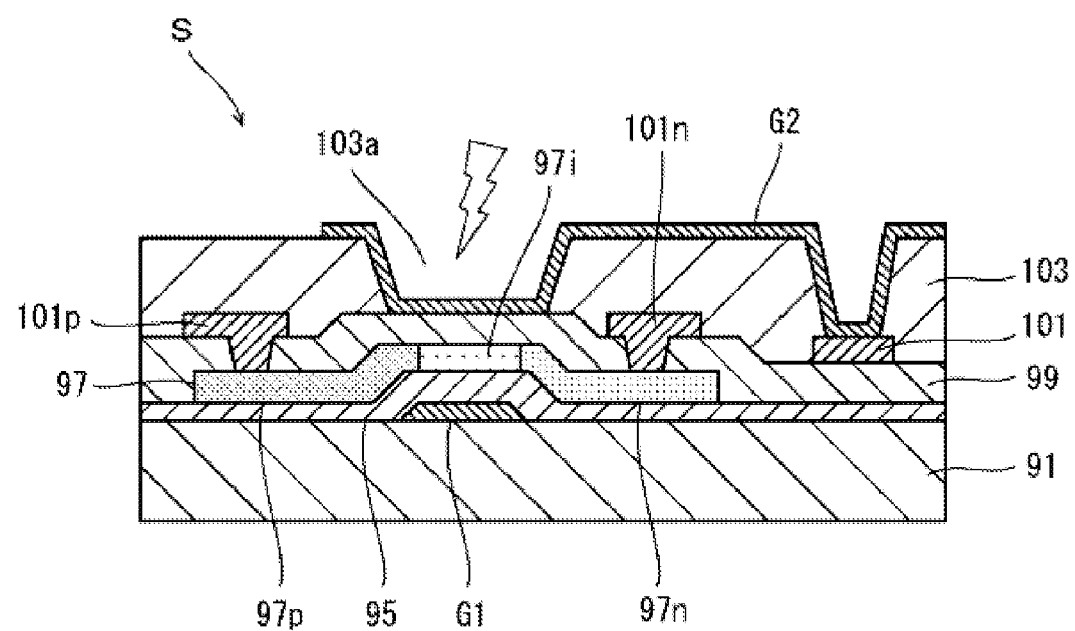
FIG. 12 is a cross-sectional view showing a configuration of a conventional optical sensor element.

FIG. 8 is a schematic plan view showing a configuration of the optical sensor of the display device of this embodiment. FIG. 9 is a cross-sectional view along the line A-A in FIG. 8. FIG. 10 is a cross-sectional view along the line B-B in FIG. 8. FIG. 11 is a cross-sectional view along the line C-C in FIG. 8.

As shown in FIGS. 8 to 11, in the configuration of this embodiment, not only the source lines SL, but also the gate lines GL have discontinuous sections in portions adjacent to the photodiode D1. At each discontinuous section of the source line SL, the source line SL is replaced by the source auxiliary wiring line 16 disposed in the same layer as the gate line GL in the same manner as Embodiment 1. On the other hand, at each discontinuous section of the gate line GL, the gate line GL is replaced by a gate auxiliary wiring line 26 that is made of the same material as that of the source line SL and that is formed in the same layer as the source line SL. The source line SL and the gate auxiliary wiring line 26 are simultaneously formed by patterning and etching a metal film that was formed as the material film.

The gate line GL and the gate auxiliary wiring line 26 are respectively formed in layers different from each other, sandwiching the buffer film 17 therebetween. Both ends of the gate auxiliary wiring line 26 in a direction in which the gate line GL extends are respectively connected to the gate line GL through contact holes 17b that penetrate the buffer film 17.

As described above, in the configuration of this embodiment, the source line SL is not present in the same layer as the bottom surface of the contact hole 19a (i.e., a surface of the buffer film 17) at a part adjacent to the optical sensor in the same manner as Embodiment 1. Therefore, unlike the conventional configuration, leakage between the transparent electrode 20 placed on the bottom surface of the contact hole 19a and the source line SL can be prevented. Further, leakage between the semiconductor layer 14 and the gate line GL can be prevented by providing a discontinuous section in the gate line GL at a part adjacent to the optical sensor.

This embodiment showed an example of the gate line GL having a discontinuous section at a part adjacent to the photodiode D1. If the reset wiring line RST or the read-out wiring line RWS shown in FIG. 2 is placed closer to the photodiode D1 than the gate line GL is, it is preferable that the reset wiring line RST or the read-out wiring line RWS have a discontinuous section and that, at the discontinuous section, the wiring line be connected to the gate auxiliary wiring line 26 disposed in the same layer as the source line SL. Further, in addition to the reset wiring line RST and the read-out wiring line RWS, if various power supply wiring lines for supplying a constant potential are placed near the photodiode D1, it is preferable that the power supply wiring lines have discontinuous sections at parts adjacent to the photodiode D1 and that, at the respective discontinuous section, both ends of the respective wiring lines be connected to the gate auxiliary wiring lines 26.

Further, in the configuration of this embodiment, it is preferable that the source auxiliary wiring line 16 be wider than the source line SL in the same manner as Embodiment 2. It is also preferable that the gate auxiliary wiring line 26 be wider than the wiring line (the gate line GL, the reset wiring line RST, or the read-out wiring line RWS) that has a discontinuous section.

INDUSTRIAL APPLICABILITY

The present invention has an industrial applicability as a display device that is provided with optical sensors in pixels and that has an image capturing function.

The invention claimed is:

1. A display device, comprising:
    an active matrix substrate having a first wiring line and a second wiring line formed so as to cross each other;
    a light detecting element disposed in a pixel region in the active matrix substrate;
    a first insulating film interposed between the first wiring line and the second wiring line;
    a second insulating film disposed on the first insulating film; and
    a transparent electrode formed above the light detecting element so as to reach inside of a through hole formed in the second insulating film,
    wherein the first wiring line has a discontinuous section at a part adjacent to the light detecting element, and both ends of the first wiring line at the discontinuous section are electrically connected to each other through an auxiliary wiring line disposed in a same layer as the second wiring line.

2. The display device according to claim 1,
    wherein the first wiring line is a source wiring line, and
    wherein the second wiring line is a gate wiring line.

3. The display device according to claim 1,
    wherein the first wiring line is a gate wiring line, and
    wherein the second wiring line is a source wiring line.

4. The display device according to claim 1,
    wherein the first wiring line is a sensor driver wiring line that supplies a signal to the light detecting element, and
    wherein the second wiring line is a source wiring line.

5. The display device according to claim 4,
    wherein the sensor driver wiring line is a reset wiring line that supplies a reset signal to the light detecting element.

6. The display device according to claim 4,
    wherein the sensor driver wiring line is a read-out wiring line that supplies a read-out signal to the light detecting element.

7. The display device according to claim 4,
    wherein the sensor driver wiring line is a power supply wiring line that supplies a constant-potential signal to the light detecting element.

8. The display device according to claim 1,
    wherein a width of the auxiliary wiring line is greater than that of the first wiring line.

9. The display device according to claim 1, further comprising:
    an opposite substrate that faces the active matrix substrate; and
    liquid crystal sandwiched between the active matrix substrate and the opposite substrate.

\* \* \* \* \*